United States Patent
Ciminelli (10) Patent No.: US 8,662,640 B2
(45) Date of Patent: Mar. 4, 2014

(54) CORROSION PROTECTED FLEXIBLE PRINTED WIRING MEMBER

(75) Inventor: Mario Joseph Ciminelli, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 207 days.

(21) Appl. No.: 13/356,964

(22) Filed: Jan. 24, 2012

(65) Prior Publication Data

US 2013/0187988 A1 Jul. 25, 2013

(51) Int. Cl.
*B41J 2/14* (2006.01)
*H05K 1/00* (2006.01)
*H05K 1/03* (2006.01)
*H05K 3/02* (2006.01)
*H05K 3/10* (2006.01)

(52) U.S. Cl.
USPC ............. 347/50; 174/250; 174/254; 174/255; 174/258; 29/846; 29/852

(58) Field of Classification Search
USPC .............. 347/50, 59; 174/250, 254, 255, 258; 29/846, 852
See application file for complete search history.

(56) References Cited

U.S. PATENT DOCUMENTS

| | | |
|---|---|---|
| 5,473,118 A | 12/1995 | Fukatake et al. |
| 7,350,902 B2 | 4/2008 | Dietl et al. |
| 8,191,249 B2 * | 6/2012 | Park ............................... 29/852 |
| 2007/0064054 A1 | 3/2007 | Hayden et al. |
| 2011/0100686 A1 * | 5/2011 | Ryoichi et al. ................. 29/852 |

* cited by examiner

*Primary Examiner* — Jannelle M Lebron
(74) *Attorney, Agent, or Firm* — Peyton C. Watkins (57) ABSTRACT

A flexible printed wiring member includes a flexible insulating base layer; a patterned copper layer disposed on the insulating base layer, the patterned copper layer including: a first portion including unplated copper leads; and a second portion including a plated metal layer disposed on the patterned copper layer; a first insulating cover layer disposed over the unplated copper leads in the first portion, the first insulating cover layer terminating at a first edge located proximate a boundary between the first portion and the second portion of the patterned copper layer; and a second insulating cover layer disposed over the first insulating cover layer, the second insulating cover layer terminating at a second edge located within the second portion of the patterned copper layer.

20 Claims, 9 Drawing Sheets

FIG. 9

CORROSION PROTECTED FLEXIBLE PRINTED WIRING MEMBER

FIELD OF THE INVENTION

The present invention relates generally to a flexible printed wiring member that can be used, for example, in an inkjet printhead, and more particularly to corrosion protection for the flexible printed wiring member.

BACKGROUND OF THE INVENTION

An inkjet printing system typically includes one or more printheads and their corresponding ink supplies. Each printhead includes an ink inlet that is connected to its ink supply and an array of drop ejectors, each ejector including an ink pressurization chamber, an ejecting actuator and a nozzle through which droplets of ink are ejected. The ejecting actuator can be one of various types, including a heater that vaporizes some of the ink in the pressurization chamber in order to propel a droplet out of the orifice, or a piezoelectric device which changes the wall geometry of the chamber in order to produce a pressure wave that ejects a droplet. The droplets are typically directed toward paper or other recording medium in order to produce an image according to image data that is converted into electronic firing pulses for the drop ejectors as the recording medium is moved relative to the printhead.

A common type of printer architecture is the carriage printer, where the printhead nozzle array is somewhat smaller than the extent of the region of interest for printing on the recording medium and the printhead is mounted on a carriage. In a carriage printer, the recording medium is advanced a given distance along a media advance direction and then stopped. While the recording medium is stopped, the printhead is moved by the carriage in a carriage scan direction that is substantially perpendicular to the media advance direction as the drops are ejected from the nozzles. After the printhead has printed a swath of the image while traversing the recording medium, the recording medium is advanced, the carriage direction of motion is reversed, and the image is formed swath by swath.

In an inkjet printer, the face of the printhead die containing the nozzle array(s) is typically positioned near the recording medium in order to provide improved print quality. Close positioning of the nozzle face of the printhead die to the recording medium keeps the printed dots close to their intended locations, even for angularly misdirected jets. A flexible printed wiring member that brings electrical signals to the printhead die is typically attached adjacent to the printhead die and is electrically interconnected to the printhead die. The electrical interconnections are subsequently encapsulated for protection. An and of the flexible printing wiring member opposite the die connection region is typically disconnectably mated to an electrical connector. Typically the flexible printed wiring member is bent between the die connection region and the electrical connector region, so that the electrical connector does not interfere with the close positioning of the printhead die to the recording medium.

The connection pads at both the die connection region and the electrical connector region are typically plated with layers of nickel and gold over the patterned copper layer of the flexible printed wiring member. An insulating cover layer is typically provided over a region of the flexible printed wiring member between the die connection region and the electrical connector region in order to prevent plating of expensive metals such as gold in this region. The insulating cover layer also provides protection of the unplated copper against corrosion. However, it has been found that at boundaries between unplated copper and the copper that has been plated (i.e. near edges of the cover layer) the unplated copper can be subject to corrosion, especially in humid or moist environments. Such corrosion can adversely affect the connection reliability of the flexible printed wiring member. This can also adversely affect the reliability of an inkjet printhead having such a flexible printed wiring member.

What is needed is a flexible printed wiring member that is less susceptible to corrosion of the unplated copper, especially near electrical interconnect pads for wire bonding or for contact with an electrical connector.

SUMMARY OF THE INVENTION

The present invention is directed to overcoming one or more of the problems set forth above. Briefly summarized, according to one aspect of the invention, the invention resides in a flexible printed wiring member comprising a flexible insulating base layer; a patterned copper layer disposed on the insulating base layer, the patterned copper layer including: a first portion including unplated copper leads; and a second portion including a plated metal layer disposed on the patterned copper layer; a first insulating cover layer disposed over the unplated copper leads in the first portion, the first insulating cover layer terminating at a first edge located proximate a boundary between the first portion and the second portion of the patterned copper layer; and a second insulating cover layer disposed over the first insulating cover layer, the second insulating cover layer terminating at a second edge located within the second portion of the patterned copper layer.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

Figure 1:
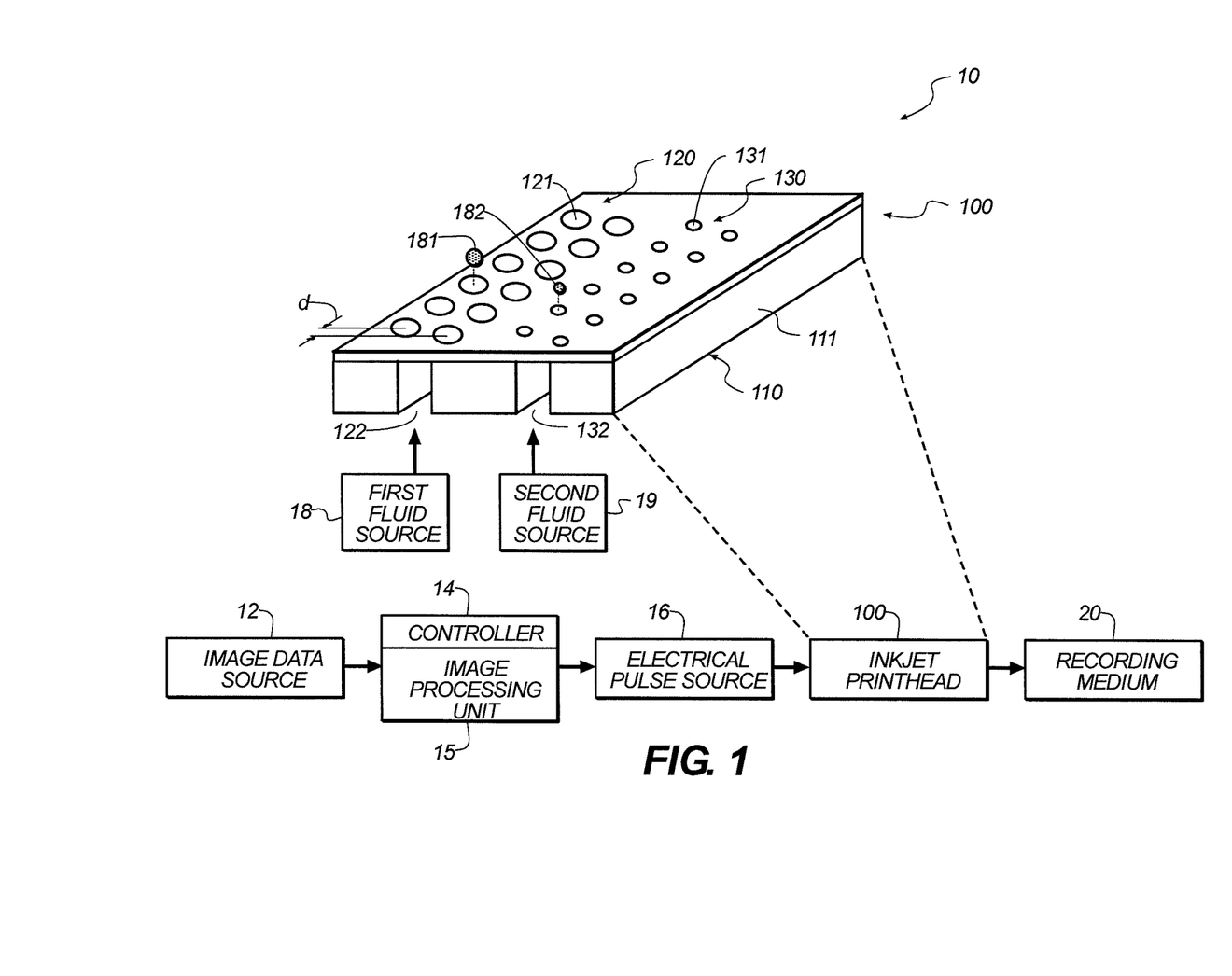
FIG. 1 is a schematic representation of an inkjet printer system.

Referring to FIG. 1, a schematic representation of an inkjet printer system 10 is shown, for its usefulness with the present invention and is fully described in U.S. Pat. No. 7,350,902, and is incorporated by reference herein in its entirety. Inkjet printer system 10 includes an image data source 12, which provides data signals that are interpreted by a controller 14 as commands to eject drops. Controller 14 includes an image processing unit 15 for rendering images for printing, and outputs signals to an electrical pulse source 16 of electrical energy pulses that are inputted to an inkjet printhead 100, which includes at least one inkjet printhead die 110.

In the example shown in FIG. 1, there are two nozzle arrays disposed at a surface of inkjet printhead die 110. Nozzles 121 in the first nozzle array 120 have a larger opening area than nozzles 131 in the second nozzle array 130. In this example, each of the two nozzle arrays has two staggered rows of nozzles 121, 131, each row having a nozzle density of 600 per inch. The effective nozzle density then in each array is 1200 per inch (i.e. $d=1/1200$ inch in FIG. 1). If pixels on the recording medium 20 were sequentially numbered along the paper advance direction, the nozzles 121, 131 from one row of an array would print the odd numbered pixels, while the nozzles 121, 131 from the other row of the array would print the even numbered pixels.

In fluid communication with each nozzle array is a corresponding ink delivery pathway. Ink delivery pathway 122 is in fluid communication with the first nozzle array 120, and ink delivery pathway 132 is in fluid communication with the second nozzle array 130. Portions of ink delivery pathways 122 and 132 are shown in FIG. 1 as openings through printhead die substrate 111. One or more inkjet printhead die 110 will be included in inkjet printhead 100, but for greater clarity only one inkjet printhead die 110 is shown in FIG. 1. The inkjet printhead die 110 are arranged on a support member as discussed below relative to FIG. 2. In FIG. 1, first ink source 18 supplies ink to first nozzle array 120 via ink delivery pathway 122, and second ink source 19 supplies ink to second nozzle array 130 via ink delivery pathway 132. Although distinct ink sources 18 and 19 are shown, in some applications it is beneficial to have a single ink source supplying ink to both the first nozzle array 120 and the second nozzle array 130 via ink delivery pathways 122 and 132 respectively. Also, in some embodiments, fewer than two or more than two nozzle arrays can be included on printhead die 110. In some embodiments, all nozzles on inkjet printhead die 110 can be the same size, rather than having multiple sized nozzles on inkjet printhead die 110.

The drop forming mechanisms associated with the nozzles are not shown in FIG. 1. Drop forming mechanisms can be of a variety of types, some of which include a heating element to vaporize a portion of ink and thereby cause ejection of a droplet, or a piezoelectric transducer to constrict the volume of a fluid chamber and thereby cause ejection, or an actuator which is made to move (for example, by heating a bi-layer element) and thereby cause ejection. In any case, electrical pulses from electrical pulse source 16 are sent to the various drop ejectors according to the desired deposition pattern. In the example of FIG. 1, droplets 181 ejected from the first nozzle array 120 are larger than droplets 182 ejected from the second nozzle array 130, due to the larger nozzle opening area. Typically other aspects of the drop forming mechanisms (not shown) associated respectively with nozzle arrays 120 and 130 are also sized differently in order to optimize the drop ejection process for the different sized drops. During operation, droplets of ink are deposited on a recording medium 20.

Figure 2:
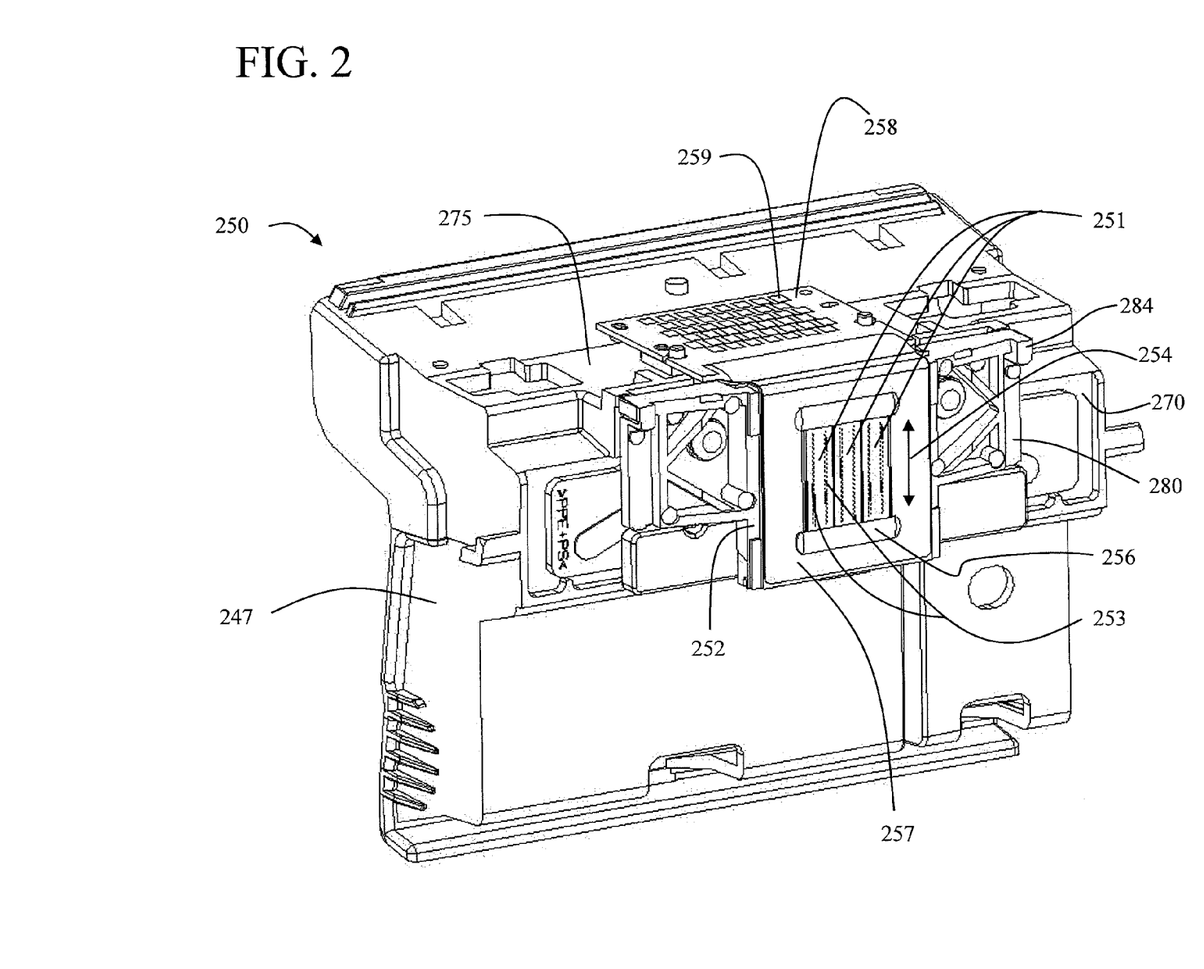
FIG. 2 is a perspective of a portion of a prior art printhead.

FIG. 2 shows a perspective of a portion of a printhead 250, which is an example of an inkjet printhead 100. Printhead 250 includes three printhead die 251 (similar to printhead die 110 in FIG. 1) that are affixed to mounting substrate 252, which is part of a mounting assembly 280 attached to a bottom side 270 of printhead body 247. Mounting assembly 280 includes alignment features 284 to facilitate accurate positioning of the printhead 250 in the printer. Each printhead die 251 contains two nozzle arrays 253, so that printhead 250 contains six nozzle arrays 253 altogether. The six nozzle arrays 253 in this example are each connected to ink sources (not shown in FIG. 2), such as cyan, magenta, yellow, text black, photo black, and protective fluid. Each of the six nozzle arrays 253 is disposed along nozzle array direction 254, and the length of each nozzle array 253 along the nozzle array direction 254 is typically on the order of 1 inch or less. Typical lengths of recording media are 6 inches for photographic prints (4 inches by 6 inches) or 11 inches for paper (8.5 by 11 inches). Thus, in order to print a full image, a number of swaths are successively printed while moving printhead 250 across the recording medium 20. Following the printing of a swath, the recording medium 20 is advanced along a media advance direction that is substantially parallel to nozzle array direction 254.

Also shown in FIG. 2 is a flexible printed wiring member 257 to which the printhead die 251 are electrically interconnected, for example, by wire bonding or TAB bonding. Flexible printed wiring member 257 is adhered to mounting substrate 252, and surrounds the printhead die 250. The interconnections are covered by an encapsulant 256 to protect them. Flexible printed wiring member 257 bends around the edge between bottom side 270 and rear side 275 of printhead 250. In the example shown in FIG. 2, the flexible printed wiring member 257 connects to a connector board 258 on rear side 275 of printhead body 247. In other examples described below with reference to FIG. 6, the flexible printed wiring member 257 includes a two dimensional array of connector pads 226 (similar to connector pads 259 on connector board 258) for contact with an electrical connector. In particular, when printhead 250 is mounted into the carriage 200 (see FIGS. 3 and 5), the connector pads 226 or 259 on a flexible printed wiring member 257 or on a connector board 258 are electrically connected to an electrical connector 234 (FIG. 5) on the carriage 200, so that electrical signals can be transmitted to the printhead die 251.

Figure 3:
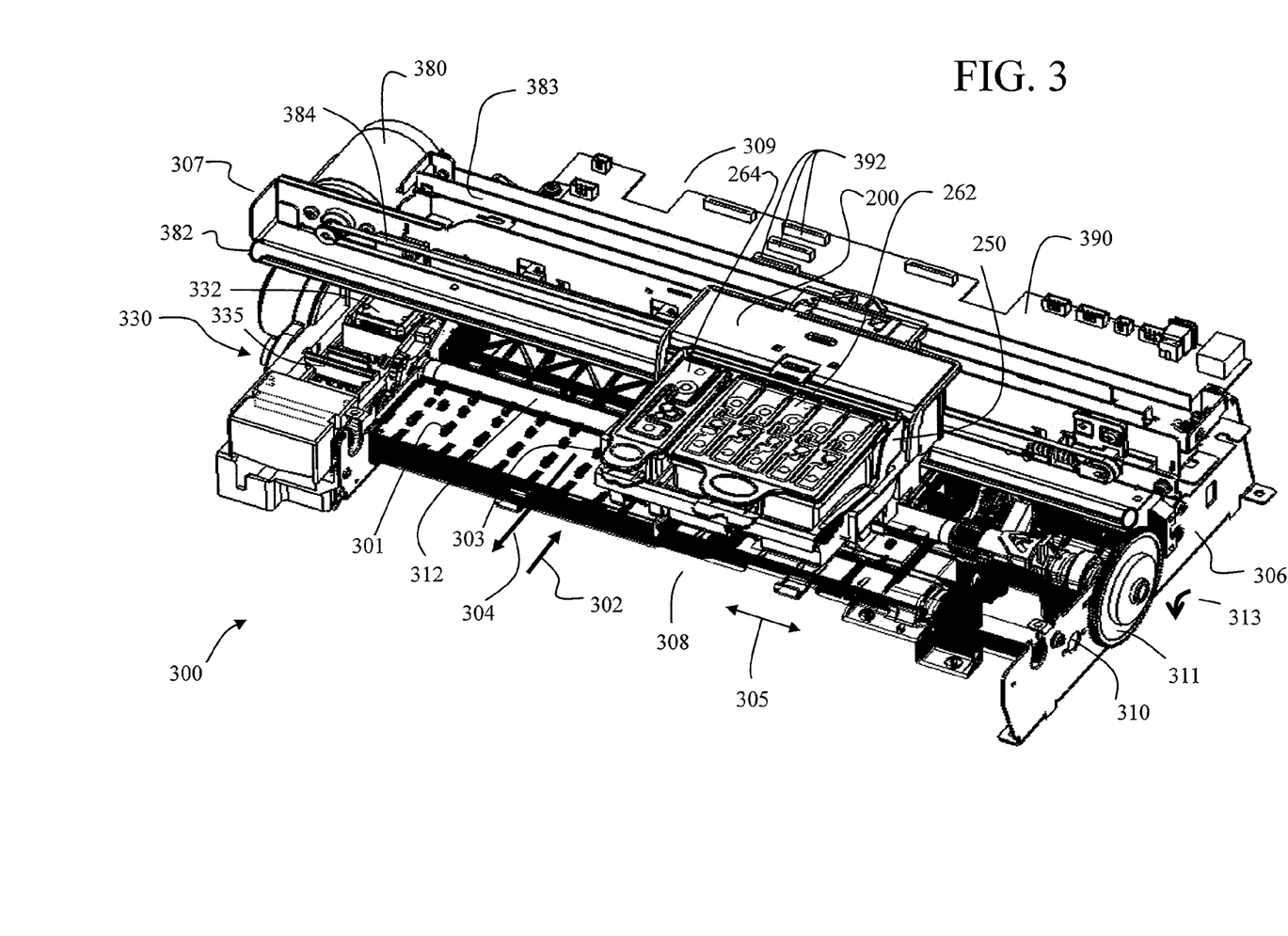
FIG. 3 is a perspective of a portion of a carriage printer.

FIG. 3 shows a portion of a desktop carriage printer. Some of the parts of the printer have been hidden in the view shown in FIG. 3 so that other parts can be more clearly seen. Printer chassis 300 has a platen 301 in print region 303 across which carriage 200 is moved back and forth in carriage scan direction 305 between the right side 306 and the left side 307 of printer chassis 300, while drops are ejected from printhead die 251 (not shown in FIG. 3) on printhead 250 that is mounted on carriage 200. Paper or other recording medium 20 is held substantially flat against platen 301, although sometimes an edge of the recording medium 20 lifts away from platen 301. Carriage motor 380 moves belt 384 to move carriage 200 along carriage guide rail 382. An encoder sensor (not shown) is mounted on carriage 200 and indicates carriage location relative to an encoder fence 383.

The mounting orientation of printhead 250 is rotated relative to the view in FIG. 2 so that the printhead die 251 are located at the bottom of printhead 250, the droplets of ink ejected downward onto the recording medium 20 in print region 303 in the view of FIG. 3. Multi-chamber ink tank 262, in this example, contains five ink sources: cyan, magenta, yellow, photo black and colorless protective fluid; while single-chamber ink tank 264 contains the ink source for text black. Ink tanks 262 and 264 can include electrical contacts (not shown) for data storage devices, for example, to track ink usage. In other arrangements, rather than having a multichamber ink tank to hold several ink sources, all ink sources are held in individual single chamber ink tanks. Paper or other recording medium 20 (sometimes generically referred to as paper or media herein) is loaded along paper load entry direction 302 toward the front of printer chassis 308.

Figure 4:
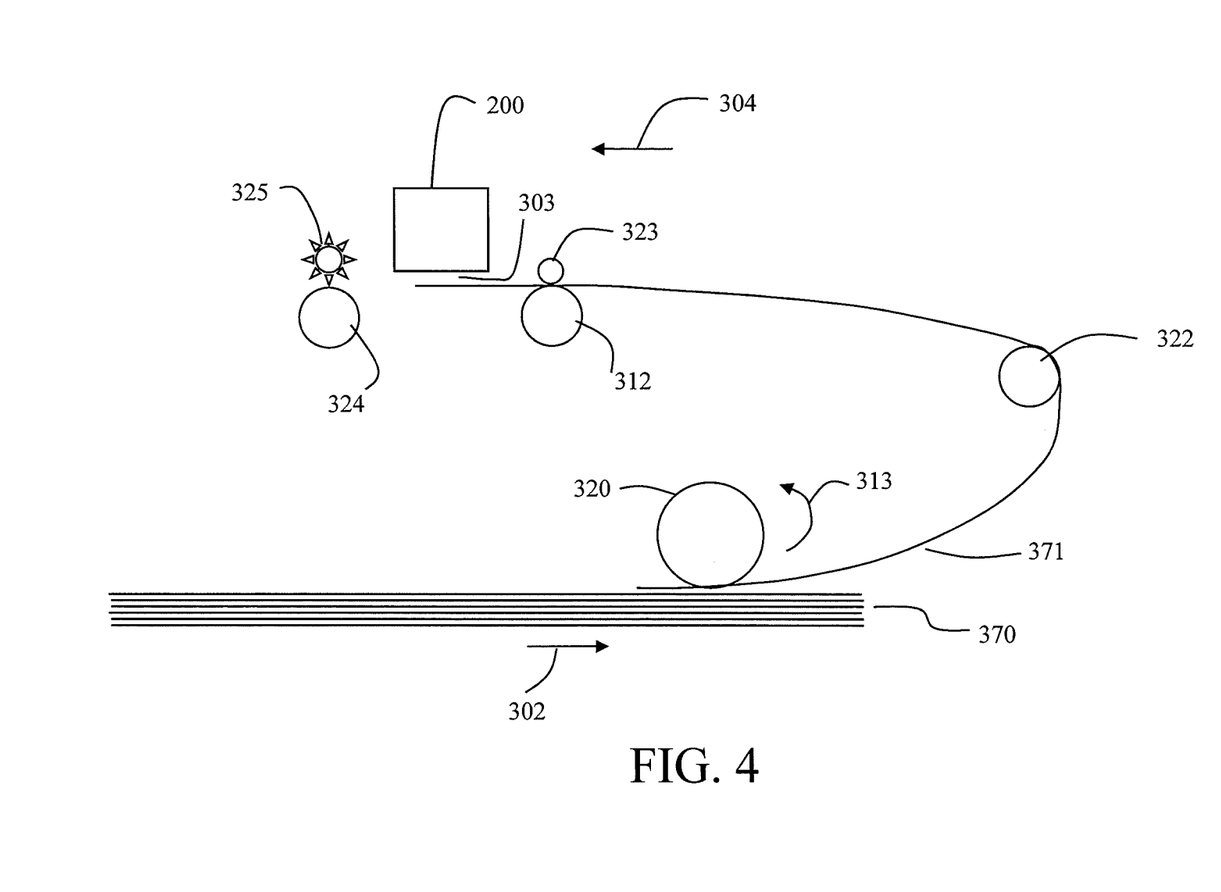
FIG. 4 is a schematic side view of an exemplary paper path in a carriage printer.

A variety of rollers are used to advance the recording medium 20 through the printer as shown schematically in the side view of FIG. 4. In this example, a pick-up roller 320 moves the top piece or sheet 371 of a stack 370 of paper or other recording medium 20 in the direction of arrow, paper load entry direction 302. A turn roller 322 acts to move the paper around a C-shaped path (in cooperation with a curved rear wall surface) so that the paper continues to advance along media advance direction 304 from the rear 309 of the printer chassis 300 (with reference also to FIG. 3). The paper is then moved by feed roller 312 and idler roller(s) 323 to advance across print region 303 (platen not shown), and from there to a discharge roller 324 and star wheel(s) 325 so that printed paper exits along media advance direction 304. Feed roller 312 includes a feed roller shaft along its axis, and feed roller gear 311 (FIG. 3) is mounted on the feed roller shaft. Feed roller 312 can include a separate roller mounted on the feed roller shaft, or can include a thin high friction coating on the feed roller shaft. A rotary encoder (not shown) can be coaxially mounted on the feed roller shaft in order to monitor the angular rotation of the feed roller.

The motor that powers the paper advance rollers is not shown in FIG. 3, but the hole 310 at the right side of the printer chassis 306 is where the motor gear (not shown) protrudes through in order to engage feed roller gear 311, as well as the gear for the discharge roller (not shown). For normal paper pick-up and feeding, it is desired that all rollers rotate in forward rotation direction 313. Toward the left side of the printer chassis 307, in the example of FIG. 3, is the maintenance station 330 including a cap 332 and a wiper 335.

Toward the rear of the printer chassis 309, in this example, is located the electronics board 390, which includes cable connectors 392 for communicating via cables (not shown) to the printhead carriage 200 and from there to the printhead 250. Also on the electronics board 390 are typically mounted motor controllers for the carriage motor 380 and for the paper advance motor, a processor and other control electronics (shown schematically as controller 14 and image processing unit 15 in FIG. 1) for controlling the printing process, and an optional connector for a cable to a host computer.

Figure 5:
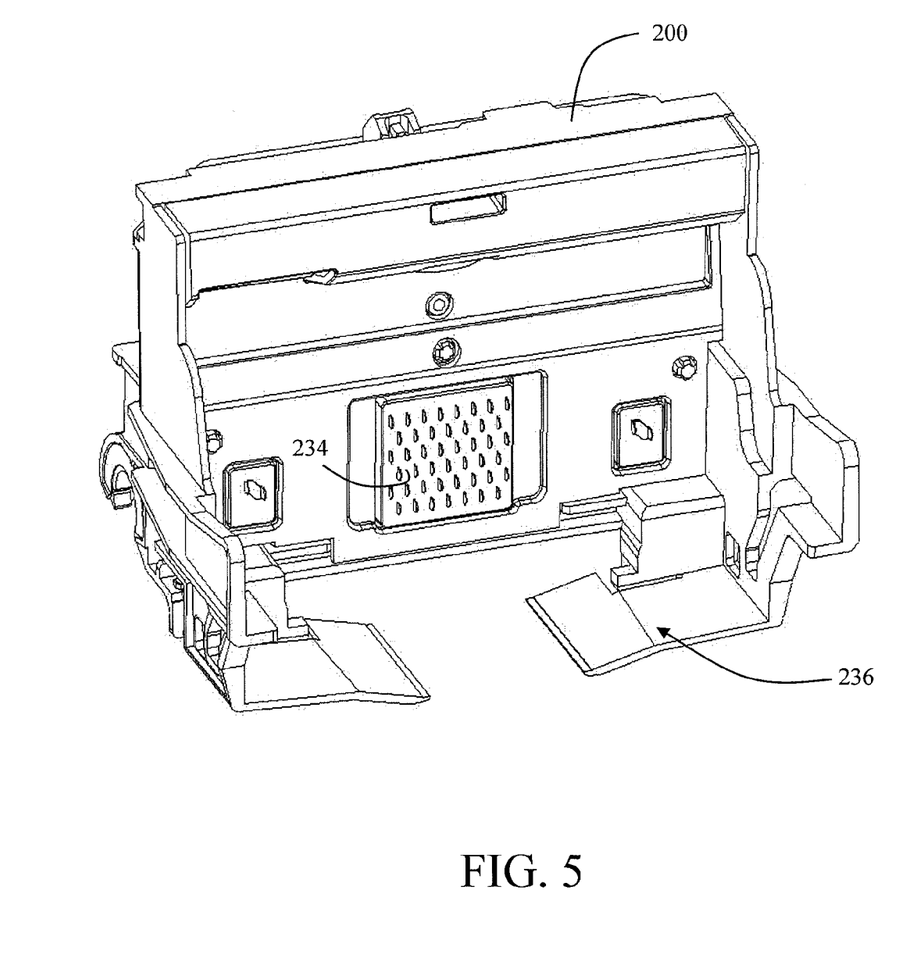
FIG. 5 is a perspective of a carriage.

FIG. 5 shows a perspective of carriage 200. When printhead 250 is inserted into holding receptacle 236 of carriage 200, connector pads 226 (FIG. 6) on flexible printing wiring member 257 or connector pads 259 (FIG. 2) on connector board 258 mate with electrical connector 234 (FIG. 5) so that electrical signals can be transmitted to the printhead die 251.

Figure 6:
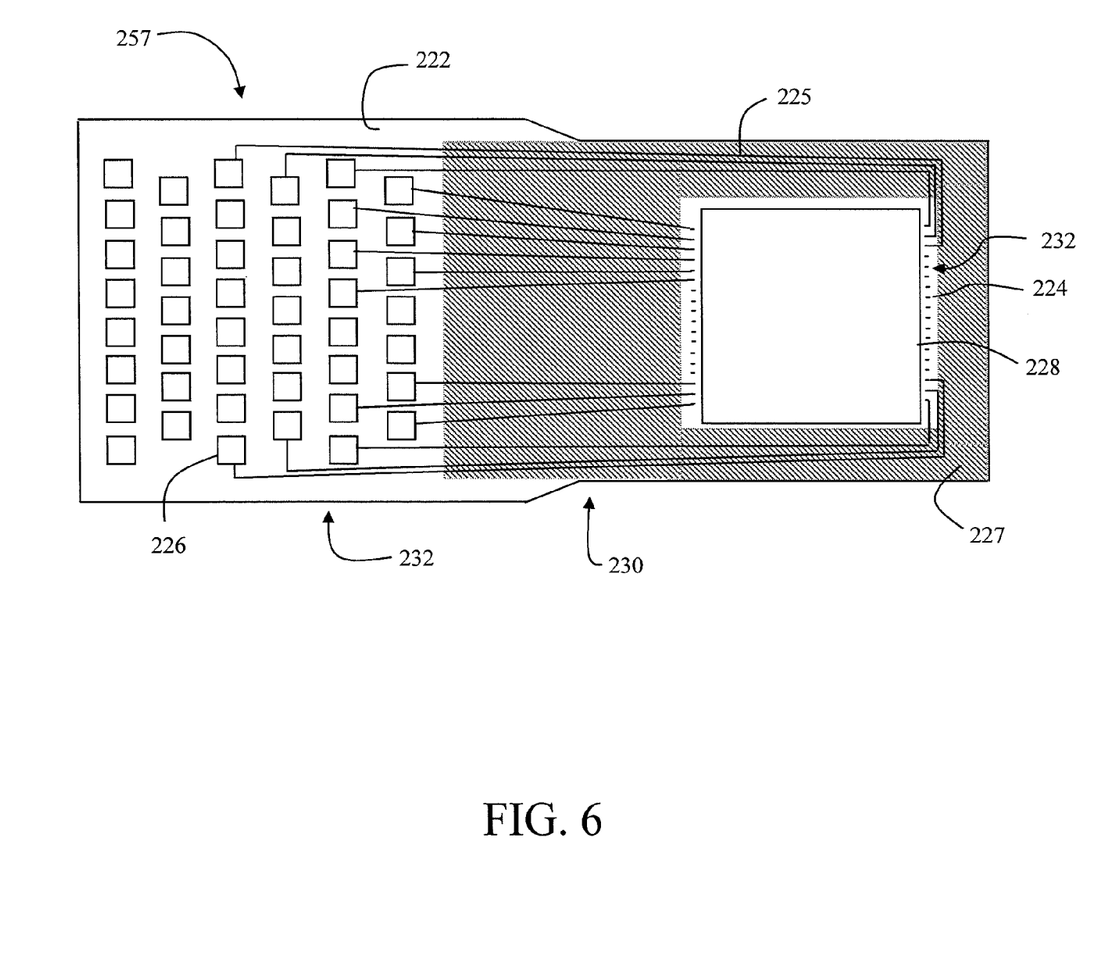
FIG. 6 is a top view of a flexible printed wiring member including an opening.

FIG. 6 shows a top view of an example of a flexible printed wiring member 257 before it has been attached to printhead 250. In the arrangement of FIG. 6, the array of connector pads 259 of connector board 258 of FIG. 2 has been incorporated into the flexible printed wiring member 257 rather than being a discrete part. Wiring portions including a plurality of leads 225, as well as a corresponding plurality of wire bond pads 224 and connector pads 226, are patterned in a copper layer disposed on a flexible insulating base layer 222 such as polyimide. The patterned copper layer includes a first portion 230 including unplated copper leads and two second portions 232 including at least one plated metal layer disposed on the patterned copper layer. In particular, in the second portions 232 a nickel layer is typically plated over the copper, and a gold layer is typically plated over the nickel, particularly at the wire bond pads 224 for reliable wire bondability and at the connector pads 226 for reliable connection to the disconnectable electrical connector 234 at the carriage 200 (FIG. 5). Insulating cover layer 227 is typically laminated over the copper leads prior to gold plating, so that the expensive plated metal material (especially the gold) is only deposited where needed. Thus, first portion 230 of the patterned copper layer corresponds substantially to where the cover layer 227 is present, and second portions 232 correspond substantially to where the cover layer 227 is not present. Cover layer 227 is typically thin (on the order of 0.03 mm). An opening 228 has been provided within flexible printed wiring member 257 to surround the printhead die 251.

Figure 7:
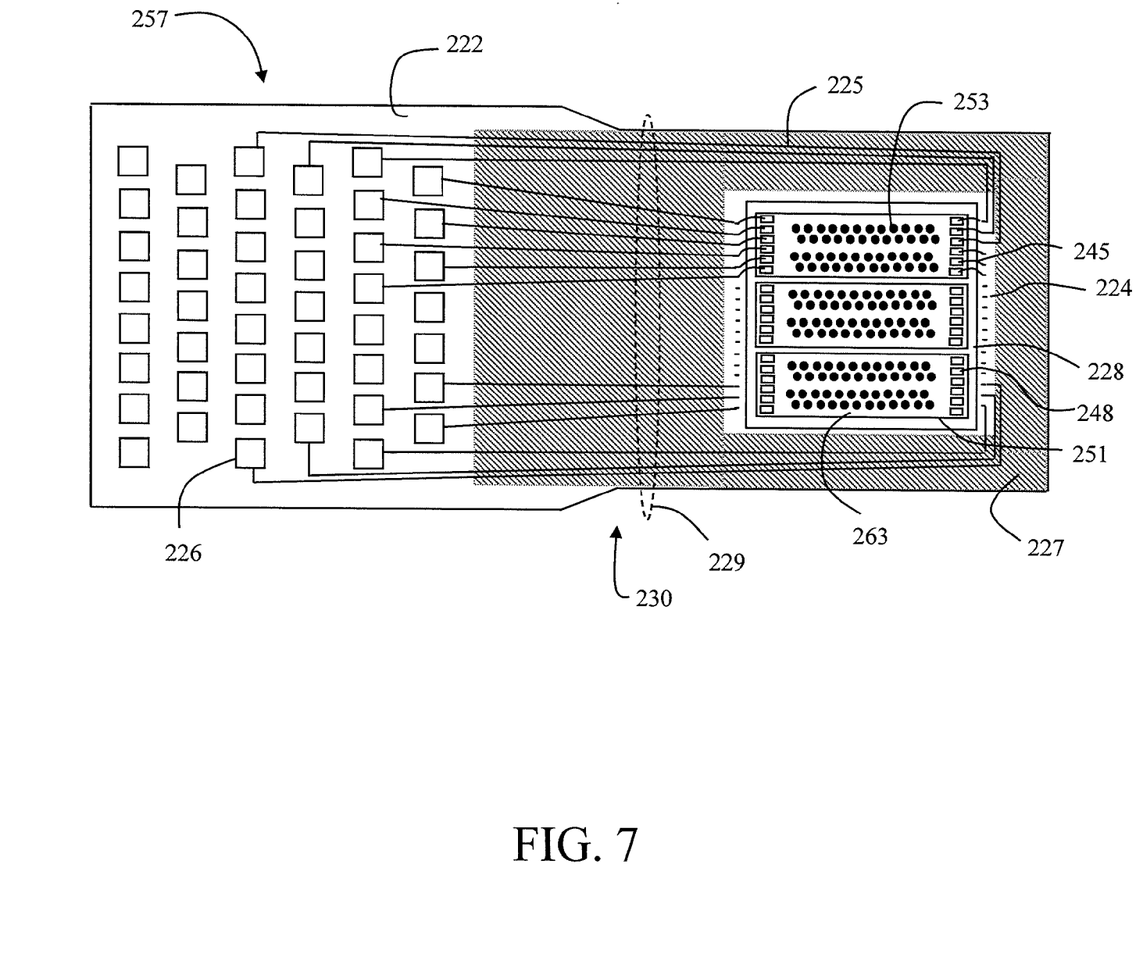
FIG. 7 is a top view of the flexible printed wiring member of FIG. 6, also including a plurality of printhead die within the opening.

FIG. 7 shows a top view of flexible printed wiring member 257 with three printhead die 251 located within opening 228. Nozzle arrays 253 and a plurality of bond pads 248 are shown on nozzle face 263. Wire bonds 245 are shown for the uppermost printhead die in FIG. 7 between the bond pads 248 and corresponding wire bond pads 226 on the flexible printed wiring member 257. The entire thickness of flexible printed wiring member 257 is on the order of 0.1 mm so that it is readily bent in bend region 229 (see also FIG. 2 with regard to flexible printed wiring member 257 bending around an edge of printhead 250). For a thin polyimide cover layer 227, leads 225 can typically be seen through the cover layer 227 (as indicated in FIG. 7). Cover layer 227 provides protection of unplated copper leads 225 against ink attack, against inadvertent shorting and against mechanical damage. In some arrangements (not shown), cover layer 227 extends all the way into the region of the connector pads 226. In such arrangements, cover layer 227 does not cover connector pads 226, but surrounds each one.

With reference to FIG. 2, a reason why flexible printed wiring member 257 is made to be flexible is that it can be advantageous to locate connector pads 226 (FIG. 6) on a different outer side of printhead body 247 than the printhead die 251 are located on so that electrical connection can be made without interfering with the close spacing between the printhead die 251 and the recording medium 20. Bottom side 270 is disposed substantially parallel to printhead die 251. Rear side 275 is disposed at an angle of about 90 degrees relative to bottom side 270 in the example of FIG. 2. Flexible printed wiring member 257 is bent so that it extends between bottom side 270 and rear side 275. More generally, the side of printhead body 247 including the connector pads 259 (or 226 of FIG. 6) is disposed at an angle between 60 degrees and 120 degrees relative to the side that is substantially parallel to the printhead die 251. With reference to FIGS. 2, 6 and 7, flexible printed wiring member 257 is bent at bend region 229 and the portion of flexible printed wiring member 257 that includes connector pads 226 is attached substantially parallel to rear side 275. Bend region 229 typically is included within first portion 230 of the patterned copper layer.

Figure 8:
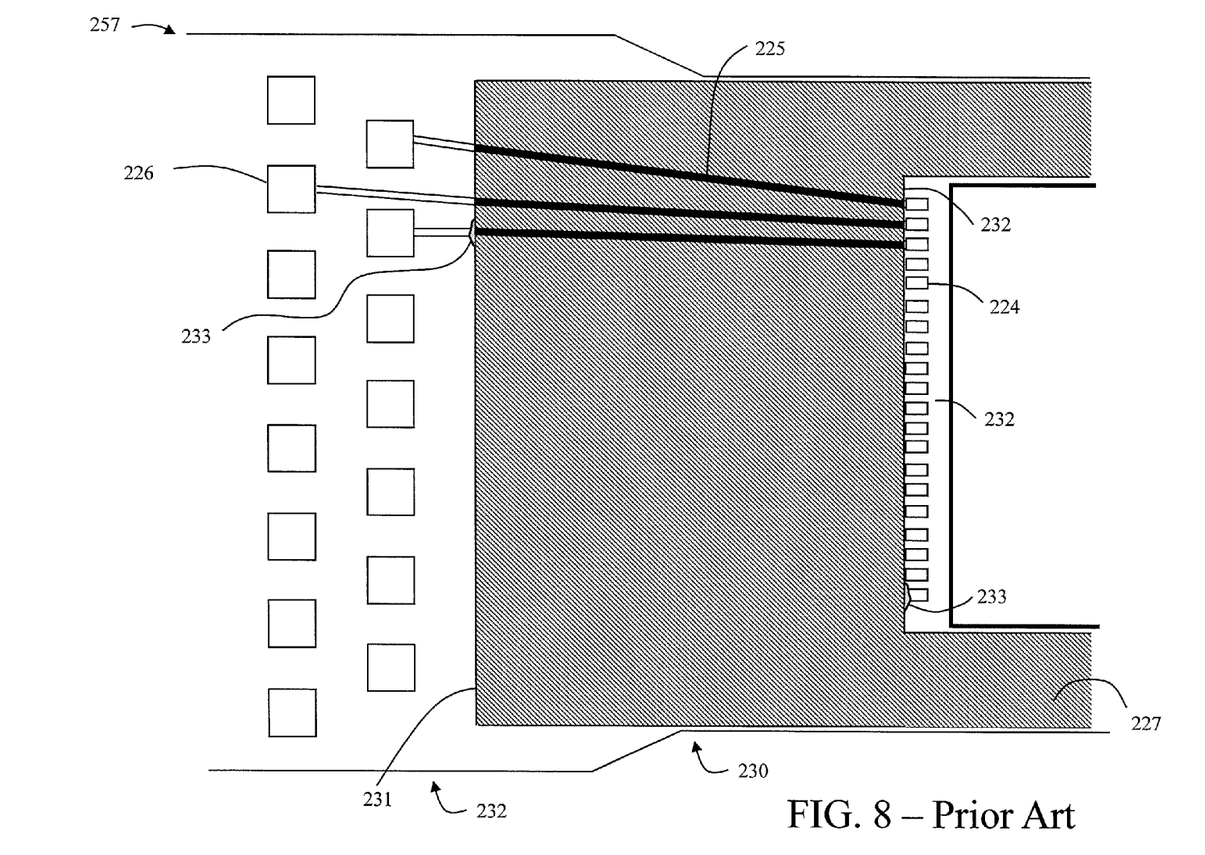
FIG. 8 is a top view a portion of a prior art flexible printed wiring member having a single cover layer.
Figure 9:
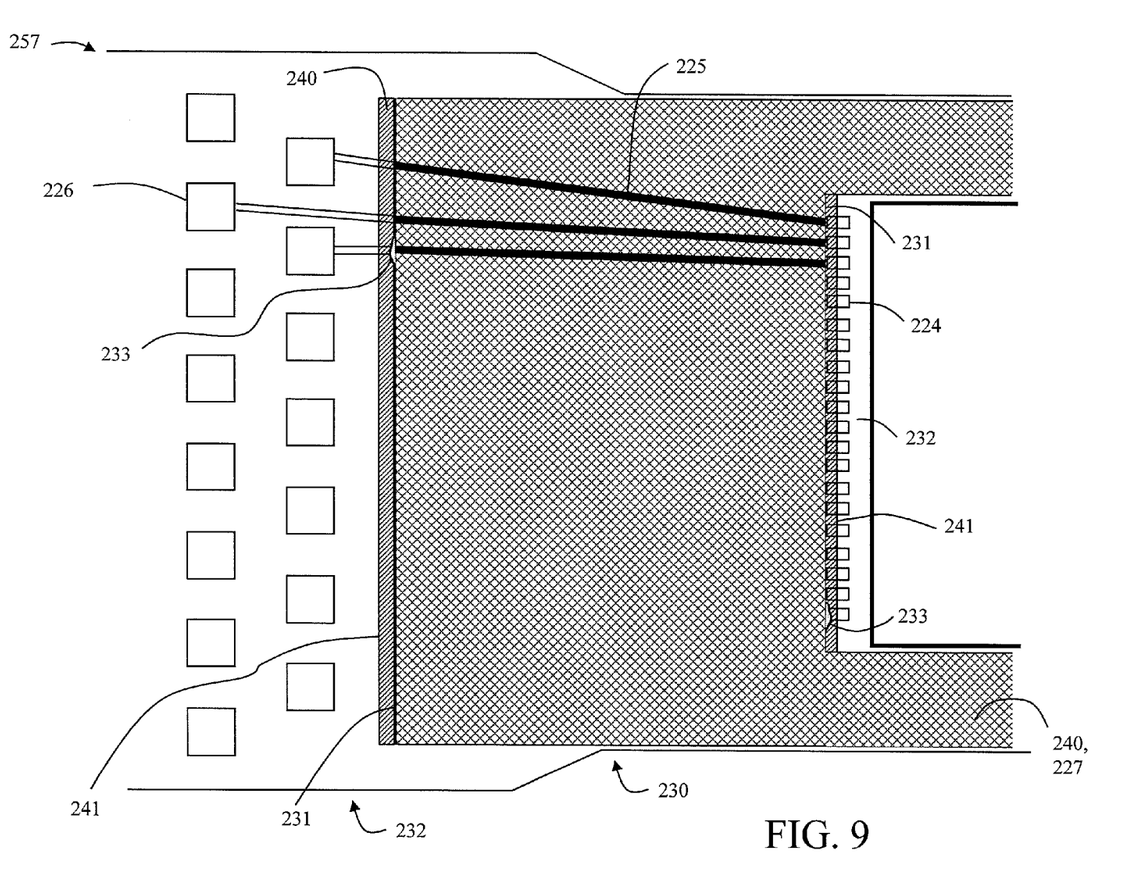
FIG. 9 is a top view of a portion of flexible printed wiring member according to an embodiment of the invention and including a second cover layer disposed over the first cover layer.

FIG. 8 shows a magnified view of a region of a prior art flexible printed wiring member 257 and illustrates a problem that can occur. Insulating cover layer 227 is disposed over the unplated copper leads 225 in the first portion 230 and terminates at an edge 231 located near a boundary between the first portion 230 (where copper leads 225 are unplated because they are covered by cover layer 227) and second portion 232 where the leads 225 and pads (including connector pads 226 and wire bond pads 224) are plated. FIG. 9 illustrates the present invention and in FIGS. 8 and 9, plated features are shown in the color white, and unplated leads 225 are shown in the color black. For simplicity only a few of the leads 225 are shown. For an example where insulating cover layer 227 is a film of an insulating material such as polyimide that is adhesively bonded, adhesive 233 can squeeze out irregularly beyond edge 231 during a pressure lamination process. In FIG. 8, only one region of adhesive 233 is shown on each edge 231 near connector pads 226 and wire bond pads 224 respectively, but there can be squeeze out of adhesive 233 all along edge 231. As shown in FIG. 8, in some places adhesive 233 can cover part of a feature that is supposed to be plated. Adhesive 233 interferes with proper plating. However, adhesive 233 can include a number of pores that can subsequently permit exposure of bare copper to humid air or moisture. As a result, such adhesively coated copper features can be subject to corrosion.

A view similar to FIG. 8, but incorporating an embodiment of the invention is shown in FIG. 9. After the plating process to deposit the nickel and gold on the second portion 232 of the patterned copper layer, a second cover layer 240 is applied over the top of the first cover layer 227. Second cover layer 240 has a larger area than first cover layer 227 does, so that second cover layer 240 terminates at a second edge 241 located within the second portion 232 of the patterned copper layer. In FIG. 9, the regions where both first cover layer 227 and second cover layer 240 are located are indicated as crosshatched. The region where second cover layer 240 extends past first cover layer 227 is indicated with slanted lines. As a result second cover layer 240 covers over some features that have been plated, and also covers the squeezed out adhesive 233, thereby providing protection against corrosion.

In second portions 232 of patterned copper layer including connector pads 226 or wire bond pads 224, second portions 232 include one or more plated pads (224 or 226) for electrical connection and a plated piece of copper lead 225 extending between the plated pad and a corresponding unplated copper lead 225. Second insulating cover layer 240 covers over at least some of the plated piece of copper lead 225.

For configurations (not shown) where first cover layer 227 surrounds each of the connector pads 226 individually, second cover layer 240 would also surround each of the connector pads 226 individually. The edge of the second cover layer 240 would be closer to the individual connector pad 226 than the edge of the first cover layer 227 would be.

With reference to FIGS. 7 and 9, it can be seen that bend region 229 can be located where both first cover layer 227 and second cover layer 240 are present. In such instances, first insulating cover layer 227 and second insulating cover layer 240 should be flexible. Flexible printed wiring member 257 includes a first end having a plurality of plated wire bond pads that are electrically connected to the bond pads 248 of the printhead die 251, and a second end having a plurality of plated connector pads 226 configured to provide connection to electrical connector 234 (FIG. 5). A bend is disposed in bend region 229 that is located between the first end and the second end.

As described above, first cover layer 227 can include an insulating film that is adhesively bonded over the unplated copper leads 225 in the first portion 230 of the patterned copper layer. Second cover layer 240 can also include an insulating film that is adhesively bonded over first cover layer 227 and extends beyond first cover layer 227. In some embodiments, first cover layer 227 or second cover layer 240 can include a patterned resin layer, such as solder mask, rather than an adhesively bonded film. Although there is no adhesive squeeze out for a patterned resin film, the plating can still have pin holes near the edge of the patterned resin film, so a second cover layer 240 can still be advantageous.

The invention has been described in detail with particular reference to certain preferred embodiments thereof, but it will be understood that variations and modifications can be effected within the spirit and scope of the invention.

PARTS LIST d density
10 Inkjet printer system
12 Image data source
14 Controller
15 Image processing unit
16 Electrical pulse source
18 First ink source
19 Second ink source
20 Recording medium
100 Inkjet printhead
110 Inkjet printhead die
111 Substrate
120 First nozzle array
121 Nozzle(s)
122 Ink delivery pathway (for first nozzle array)
130 Second nozzle array
131 Nozzle(s)
132 Ink delivery pathway (for second nozzle array)
181 Droplet(s) (ejected from first nozzle array)
182 Droplet(s) (ejected from second nozzle array)
200 Carriage
222 Flexible base layer
224 Wire bond pads
225 Leads
226 Connector pads
227 Cover layer
228 Opening
229 Bend region
230 First portion (of patterned copper layer)
231 Edge (of cover layer)
232 Second portion (of patterned copper layer)
233 Adhesive
234 Electrical connector
236 Holding receptacle
240 Second cover layer
245 Wire bond
247 Printhead body
248 Bond pads
250 Printhead
251 Printhead die
252 Mounting substrate
253 Nozzle array
254 Nozzle array direction
256 Encapsulant
257 Flexible printed wiring member
258 Connector board
259 Connector pads
262 Multichamber ink tank
263 Nozzle face
264 Single chamber ink tank
270 Bottom side (of printhead)
275 Rear side (of printhead)
280 Mounting assembly
282 Extended portion (of mounting assembly)
284 Alignment features
300 Printer chassis
301 Platen
302 Paper load entry direction
303 Print region
304 Media advance direction
305 Carriage scan direction
306 Right side of printer chassis
307 Left side of printer chassis
308 Front of printer chassis
309 Rear of printer chassis
310 Hole (for paper advance motor drive gear)
311 Feed roller gear
312 Feed roller
313 Forward rotation direction (of feed roller)
320 Pick-up roller
322 Turn roller
323 Idler roller
324 Discharge roller
325 Star wheel(s)
330 Maintenance station
332 Cap
335 Wiper
370 Stack of media 371 Top piece of medium
380 Carriage motor
382 Carriage guide rail
383 Encoder fence
384 Belt
390 Printer electronics board
392 Cable connectors

The invention claimed is:

1. A flexible printed wiring member comprising:
a flexible insulating base layer;
a patterned copper layer disposed on the insulating base layer, the patterned copper layer including:
a first portion including unplated copper leads; and
a second portion including a plated metal layer disposed on the patterned copper layer;
a first insulating cover layer disposed over the unplated copper leads in the first portion, the first insulating cover layer terminating at a first edge located proximate a boundary between the first portion and the second portion of the patterned copper layer; and
a second insulating cover layer disposed over the first insulating cover layer, the second insulating cover layer terminating at a second edge located within the second portion of the patterned copper layer.

2. The flexible printed wiring member of claim 1, wherein the first insulating cover layer and the second insulating cover layer are flexible.

3. The flexible printing wiring member of claim 1, wherein the first insulating cover layer includes a patterned resin layer.

4. The flexible printed wiring member of claim 1, the second portion of the patterned copper layer including a plated pad for electrical connection and a plated piece of copper lead extending between the plated pad and a corresponding unplated copper lead disposed in the first portion of the patterned copper layer, wherein the second insulating cover layer is disposed over at least some of the plated piece of copper lead.

5. The flexible printed wiring member of claim 4, wherein the plated pad is a wire bond pad.

6. The flexible printed wiring member of claim 4, wherein the plated pad is configured to provide connection to a disconnectable electrical connector.

7. The flexible printed wiring member of claim 1, the plated metal layer including a gold layer.

8. The flexible printed wiring member of claim 7, the plated metal layer including a nickel layer disposed between the patterned copper layer and the gold layer.

9. The flexible printed wiring member of claim 1, wherein the first insulating cover layer including an insulating member that is adhesively bonded over the first portion of the patterned copper layer.

10. The flexible printed wiring member of claim 9, wherein some adhesive extends beyond the first edge of the first insulating cover layer.

11. An inkjet printhead comprising:
a printhead die including an array of nozzles and a plurality of bond pads;
a flexible printed wiring member disposed adjacent the printhead die, the flexible printed wiring member including:
a flexible insulating base layer;
a patterned copper layer disposed on the insulating base layer, the patterned copper layer including:
a first portion including unplated copper leads; and
a second portion including a plated metal layer disposed on the patterned copper layer;
a first insulating cover layer disposed over the unplated copper leads in the first portion, the first insulating cover layer terminating at a first edge located proximate a boundary between the first portion and the second portion of the patterned copper layer; and
a second insulating cover layer disposed over the first insulating cover layer, the second insulating cover layer terminating at a second edge located within the second portion of the patterned copper layer; and
a plurality of electrical interconnections connecting the bond pads of the printhead die to the flexible printed wiring member.

12. The inkjet printhead of claim 11, the second portion of the patterned copper layer including a plated pad for electrical connection and a plated piece of copper lead extending between the plated pad and a corresponding unplated copper lead disposed in the first portion of the patterned copper layer, wherein the second insulating cover layer is disposed over at least some of the plated piece of copper lead.

13. The inkjet printhead of claim 12, wherein the plated pad is a wire bond pad that is electrically connected to a bond pad of the printhead die by a wire bond.

14. The inkjet printhead of claim 11 further including a body including:
a first side disposed substantially parallel to the printhead die; and
a second side disposed at an angle between 60 degrees and 120 degrees relative to the first side, the flexible printed wiring member extending between the first side and the second side.

15. The inkjet printhead of claim 14, the first portion of the patterned copper layer of the flexible printed wiring member including a bend.

16. An inkjet printer comprising:
a print region;
a carriage configured to move back and forth across the print region; and
an inkjet printhead mounted on the carriage, the inkjet printhead including:
a printhead die including an array of nozzles and a plurality of bond pads;
a flexible printed wiring member disposed adjacent the printhead die, the flexible printed wiring member including:
a flexible insulating base layer;
a patterned copper layer disposed on the insulating base layer, the patterned copper layer including:
a first portion including unplated copper leads; and
a second portion including a plated metal layer disposed on the patterned copper layer;
a first insulating cover layer disposed over the unplated copper leads in the first portion, the first insulating cover layer terminating at a first edge located proximate a boundary between the first portion and the second portion of the patterned copper layer;
a second insulating cover layer disposed over the first insulating cover layer, the second insulating cover layer terminating at a second edge located within the second portion of the patterned copper layer; and
a plurality of electrical interconnections connecting the bond pads of the printhead die to the flexible printed wiring member.

17. The inkjet printer of claim 16, the second portion of the patterned copper layer including a plated pad for electrical connection and a plated piece of copper lead extending between the plated pad and a corresponding unplated copper lead disposed in the first portion of the patterned copper layer, wherein the second insulating cover layer is disposed over at least some of the plated piece of copper lead.

18. The inkjet printer of claim 17, wherein the plated pad includes a wire bond pad that is electrically connected to a bond pad of the printhead die by a wire bond.

19. The inkjet printer of claim 17 further including an electrical connector mounted on the carriage, wherein the plated pad includes a connector pad configured to provide connection to the electrical connector.

20. The inkjet printer of claim 19, the flexible printed wiring member including:
- a first end having a plurality of plated wire bond pads that are electrically connected to the bond pads of the printhead die;
- a second end having a plurality of plated connector pads configured to provide connection to the electrical connector; and
- a bend disposed between the first end and the second end.

* * * * *